(12) United States Patent
Takeuchi et al.

(10) Patent No.: US 9,608,104 B2
(45) Date of Patent: Mar. 28, 2017

(54) SILICON CARBIDE SEMICONDUCTOR DEVICE AND METHOD FOR MANUFACTURING SAME

(71) Applicant: DENSO CORPORATION, Kariya, Aichi-pref. (JP)

(72) Inventors: Yuichi Takeuchi, Kariya (JP); Naohiro Suzuki, Kariya (JP); Jun Morimoto, Toyota (JP); Narumasa Soejima, Nisshin (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 14/894,668

(22) PCT Filed: May 28, 2014

(86) PCT No.: PCT/JP2014/002812
§ 371 (c)(1),
(2) Date: Nov. 30, 2015

(87) PCT Pub. No.: WO2014/196164
PCT Pub. Date: Dec. 11, 2014

(65) Prior Publication Data
US 2016/0104794 A1     Apr. 14, 2016

(30) Foreign Application Priority Data
Jun. 5, 2013 (JP) ................. 2013-118962

(51) Int. Cl.
*H01L 29/78* (2006.01)
*H01L 29/16* (2006.01)
(Continued)

(52) U.S. Cl.
CPC ...... *H01L 29/7813* (2013.01); *H01L 29/1095* (2013.01); *H01L 29/1608* (2013.01);
(Continued)

(58) Field of Classification Search
CPC ............ H01L 29/1095; H01L 29/1608; H01L 29/7397
See application file for complete search history.

(56) References Cited

U.S. PATENT DOCUMENTS

| 5,021,845 A | 6/1991 | Hashimoto |
| 5,489,787 A | 2/1996 | Amaratunga et al. |

(Continued)

FOREIGN PATENT DOCUMENTS

| JP | 2003-318388 A | 11/2003 |
| JP | 2008-311542 A | 12/2008 |
| JP | 2012-234848 A | 11/2012 |

OTHER PUBLICATIONS

International Search Report of the International Searching Authority dated Jul. 22, 2014 issued in the corresponding International application No. PCT/JP2014/002812 (and English translation).
(Continued)

*Primary Examiner* — Matthew Reames
(74) *Attorney, Agent, or Firm* — Posz Law Group, PLC (57) ABSTRACT

A silicon carbide semiconductor device includes: a vertical MOSFET having: a semiconductor substrate including a high-concentration impurity layer and a drift layer; a base region; a source region; a trench gate structure; a source electrode; and a drain electrode. The base region has a high-concentration base region and a low-concentration base region having a second conductivity type with an impurity concentration lower than the high-concentration base region, which are stacked each other. Each of the high-concentration base region and the low-concentration base region contacts a side surface of the trench.

8 Claims, 4 Drawing Sheets

(51) Int. Cl.
    *H01L 29/66*     (2006.01)
    *H01L 29/10*     (2006.01)
    *H01L 21/02*     (2006.01)
    *H01L 21/04*     (2006.01)

(52) U.S. Cl.
    CPC .... *H01L 29/66068* (2013.01); *H01L 21/0262* (2013.01); *H01L 21/02529* (2013.01); *H01L 21/02579* (2013.01); *H01L 21/041* (2013.01)

(56) References Cited

U.S. PATENT DOCUMENTS

| | | | |
|---|---|---|---|
| 5,744,826 | A | 4/1998 | Takeuchi et al. |
| 6,133,587 | A | 10/2000 | Takeuchi et al. |
| 2001/0026977 | A1 | 10/2001 | Hattori et al. |
| 2002/0060315 | A1 | 5/2002 | Yokogawa et al. |
| 2002/0142527 | A1 | 10/2002 | Gassel et al. |
| 2003/0089966 | A1 | 5/2003 | Hattori et al. |
| 2004/0022025 | A1 | 2/2004 | Yokogawa et al. |
| 2004/0089886 | A1 | 5/2004 | Hattori et al. |
| 2005/0062064 | A1 | 3/2005 | Hattori et al. |
| 2008/0116512 | A1 | 5/2008 | Kawaguchi et al. |
| 2009/0114969 | A1 | 5/2009 | Suzuki et al. |
| 2009/0200559 | A1 | 8/2009 | Suzuki et al. |
| 2011/0068353 | A1 | 3/2011 | Nakano |
| 2012/0280255 | A1 | 11/2012 | Masuda et al. |
| 2013/0181229 | A1* | 7/2013 | Masuda .............. H01L 29/6606 257/77 |
| 2014/0034969 | A1 | 2/2014 | Nakano |
| 2015/0179765 | A1 | 6/2015 | Masuda et al. |

OTHER PUBLICATIONS

Written Opinion of the International Searching Authority dated Jul. 22, 2014 issued in the corresponding International application No. PCT/JP2014/002812 (and English translation).

Japanese Office Action mailed on Dec. 8, 2015 in the corresponding JP application No. 2013-118962. (English translation attached).

* cited by examiner

SILICON CARBIDE SEMICONDUCTOR DEVICE AND METHOD FOR MANUFACTURING SAME

CROSS REFERENCE TO RELATED APPLICATIONS

This application is a U.S. national stage of International Application No. PCT/JP2014/002812 filed on May 28, 2014 and is based on Japanese Patent Application No. 2013-118962 filed on Jun. 5, 2013, the disclosures of which are incorporated herein by reference.

TECHNICAL FIELD

The present disclosure relates to a silicon carbide (hereinafter referred to as "SiC") semiconductor device having a vertical MOSFET with a trench gate structure, and a method of manufacturing the silicon carbide semiconductor device.

BACKGROUND ART

In a vertical MOSFET with an inverting trench gate structure, a gate voltage is applied to a gate electrode formed within a trench to define a channel in a p-type base region located on a trench side, and performs operation of allowing a current to flow between a drain and a source through the channel. In the vertical MOSFET of this type, an impurity concentration dependence in a p-type base region on an on-resistance and an element breakdown voltage is large. In other words, when an impurity concentration in a p-type base region is lowered, a channel mobility can be increased, a channel resistance is reduced, and the on-resistance is reduced. On the other hand, a breakdown voltage between the drain and the source is lowered due to a punch-through phenomenon to decrease the element breakdown voltage. For that reason, it is essentially difficult to perform both of the realization of a high channel mobility and the securement of the element breakdown voltage.

In order to solve the above problem, Patent Literature 1 has proposed an SiC semiconductor device in which a low-concentration n-type thin film layer is formed over an overall side surface of a trench in a vertical MOSFET having a trench gate structure. In the SiC semiconductor device, an $n^-$ type drift layer and a p-type base region are formed in order on an $n^+$ type substrate as a semiconductor substrate. An $n^+$ type source region is formed in a surface layer portion of the p-type base region, and a trench is defined to penetrate through the $n^+$ type source region and the p-type base region. An n-type thin film layer is provided on a side surface of the trench, and a gate electrode is provided on a surface of the n-type thin film layer through a gate insulating film. A source electrode electrically connected to the $n^+$ type source region is provided on a front surface side of the semiconductor substrate, and a drain electrode electrically connected to the $n^+$ type substrate is provided on a rear surface side of the semiconductor substrate. Thus, a vertical MOSFET with a trench gate structure is configured.

In the SiC semiconductor device configured as described above, a channel is defined in the n-type thin film layer, and a current flows between the drain and the source through the n-type thin film layer. Therefore, because the channel mobility can be set on the basis of the impurity concentration of the n-type thin film layer, the channel mobility is increased to reduce the on-resistance. Because the impurity concentration in the p-type base region can be set without taking the channel mobility into consideration, the element breakdown voltage can be also ensured.

However, in the vertical MOSFET with the trench gate structure disclosed in the above-mentioned Patent Literature 1, such a problem that the self-turn-on occurs when noise enters the gate electrode in association with a reduction in a threshold voltage determined by the impurity concentration of the n-type thin film layer occurs.

PRIOR ART LITERATURES

Patent Literature

Patent Literature 1 JP-H09-199724 A

SUMMARY OF INVENTION

It is an object of the present disclosure to provide a silicon carbide semiconductor device having a vertical MOSFET with a trench gate structure which reduces an on-resistance and ensures an element breakdown voltage, and obtains a high threshold voltage, and a method for manufacturing the silicon carbide semiconductor device.

According to an aspect of the present disclosure, a silicon carbide semiconductor device includes: a vertical MOSFET having a semiconductor substrate; a base region; a source region; a trench gate structure; a source electrode; and a drain electrode. The semiconductor substrate is made of silicon carbide having a first conductivity type, and includes a high-concentration impurity layer arranged on a rear surface side and a drift layer arranged on a front surface side and having an impurity concentration lower than the high-concentration impurity layer. The base region is made of silicon carbide, and arranged on the drift layer. The source region is arranged in an upper portion of the base region, and made of silicon carbide having the first conductivity type with an impurity concentration higher than the drift layer. The trench gate structure includes a trench extending from a surface of the source region to a position deeper than the base region, a gate insulating film arranged on an inner wall of the trench, and a gate electrode arranged on the gate insulating film. The source electrode is electrically connected to the source region. The drain electrode is electrically connected to the high-concentration impurity layer on the rear surface side of the semiconductor substrate. The base region has a high-concentration base region and a low-concentration base region, which are stacked each other, the low-concentration base region having a second conductivity type with an impurity concentration lower than the high-concentration base region. Each of the high-concentration base region and the low-concentration base region contacts a side surface of the trench.

The base region is formed by laminating a high-concentration base region and a low-concentration base region lower in a second conductivity type impurity concentration than the high-concentration base region on each other. The high-concentration base region and the low-concentration base region come in contact with a side surface of the trench.

The silicon carbide semiconductor device has a vertical MOSFET with the trench gate structure, enables a reduction in an on-resistance and the securement of an element breakdown voltage, and obtains a high threshold voltage.

According to another aspect of the present disclosure, a method of manufacturing a silicon carbide semiconductor device, includes: preparing a semiconductor substrate, which is made of silicon carbide having a first conductivity type, and includes a high-concentration impurity layer on a rear surface side and a drift layer arranged on a front surface side and having an impurity concentration lower than the high-concentration impurity layer; forming a base region made of silicon carbide on the drift layer; forming a source region, which is made of silicon carbide having the first conductivity type with an impurity concentration higher than the drift layer, in an upper portion of the base region; forming a trench extending from a surface of the source region to a position deeper than the base region; providing a trench gate structure by forming a gate insulating film on an inner wall of the trench, and forming a gate electrode on the gate insulating film; forming a source electrode electrically connected to the source region; and forming a drain electrode electrically connected to the high-concentration impurity layer on the rear surface side of the semiconductor substrate.

In the forming of the base region, a high-concentration base region and a low-concentration base region having a second conductivity type with an impurity concentration lower than the high-concentration base region are stacked each other. In the forming of the trench, the trench is formed to be deeper than the base region, and each of the high-concentration base region and the low-concentration base region contacts a side surface of the trench.

The manufacturing method provides to manufacture a silicon carbide semiconductor device having a vertical MOSFET with a trench gate structure, which enables a reduction in an on-resistance and the securement of an element breakdown voltage, and obtains a high threshold voltage.

BRIEF DESCRIPTION OF DRAWINGS

The above and other objects, features and advantages of the present disclosure will become more apparent from the following detailed description made with reference to the accompanying drawings. In the drawings.

EMBODIMENTS FOR CARRYING OUT INVENTION

Hereinafter, embodiments according to the present disclosure will be described with reference to the drawings. En each of the following embodiments, the description will be provided using the same reference numerals for the same or equivalent portions.

First Embodiment

A description will be given of an SiC semiconductor device in which an inverting vertical MOSFET with a trench gate structure is formed according to a first embodiment of the present disclosure with reference to FIG. 1.

Figure 1:
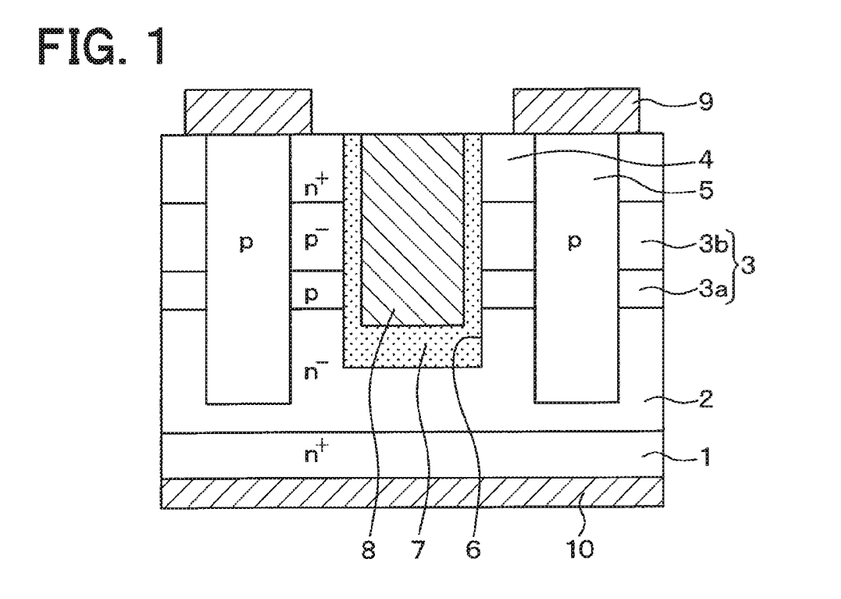
FIG. 1 is a cross-sectional view of an SiC semiconductor device having a vertical MOSFET with an inverting trench gate structure according to a first embodiment of the present disclosure.

The SiC semiconductor device illustrated in FIG. 1 is configured in which a vertical MOSFET with a trench gate structure is formed in a cell region, and an outer peripheral breakdown voltage structure is provided in an outer peripheral region surrounding the cell region although not shown.

The SiC semiconductor device is formed with a semiconductor substrate in which an $n^-$ type drift layer 2 is formed on a front surface side of an $n^+$ type substrate 1. The $n^-$ type drift layer 2 is made of SiC having an impurity concentration lower than that of the $n^+$ type substrate 1. The $n^+$ type substrate 1 configures a high-concentration impurity layer made of SiC. The $n^+$ type substrate 1 is set to, for example, $1.0 \times 10^{19}/cm^3$ in an n-type impurity concentration, and the $n^-$ type drift layer 2 is set to, for example, 0.5 to $2.0 \times 10^{16}/cm^3$ in the n-type impurity concentration.

A base region 3 is formed on an upper layer portion of the $n^-$ type drift layer 2. In the case of this embodiment, the base region 3 is made of a p-type SiC higher in impurity concentration than the $n^-$ type drift layer 2, and structured in such a manner that a high-concentration base region 3a and a low-concentration base region 3b are laminated on each other in order. The high-concentration base region 3a is set to be relatively high in the p-type impurity concentration, and the low-concentration base region 3b is set to be lower in the p-type impurity concentration than the high-concentration base region 3a.

Figure 2:
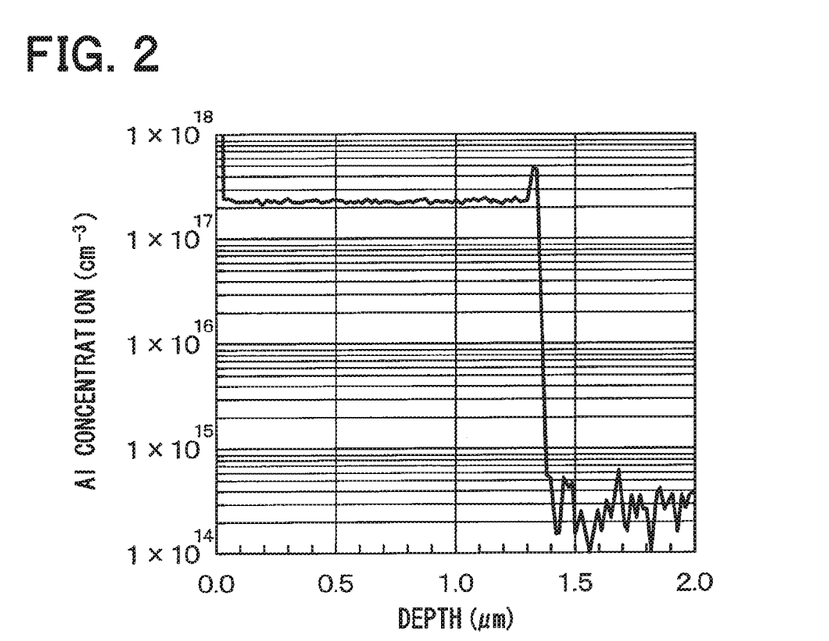
FIG. 2 is a graph showing a p-type impurity concentration profile in a base region.

The high-concentration base region 3a is set to, for example, $5 \times 10^{17}/cm^3$ or higher, for example, $1 \times 10^{16}/cm^3$ in the p-type impurity concentration, and set to 30 to 200 nm in thickness. The low-concentration base region 3b is set to, for example, $1.0 \times 10^{16}/cm^3$ or lower in the p-type impurity concentration, and set to 0.5 to 1.5 μm in thickness. For example, the base region 3 is configured with a concentration profile of p-type impurity (Al: aluminum) illustrated in FIG. 2. In other words, as illustrated in FIG. 2, the low-concentration base region 3b is formed with the p-type impurity concentration of about $2.5 \times 10^{17}/cm^3$, for example, in a depth of about 1.3 μm from a surface of the base region 3. The high-concentration base region 3a is formed in such a manner that a doping amount of the p-type impurity is increased in a pulsed manner at a position of about 1.3 to 1.4 μm in the depth from the surface of the base region 3 so that the p-type impurity concentration becomes about $5 \times 10^{17}/cm^3$.

Further, an $n^+$ type source region 4 is formed on an upper layer portion of the base region 3. $P^+$ type SiC layers 5 are formed to reach the $n^-$ type drift layer 2 from the surface of the $n^+$ type source region 4 through the $n^+$ type source regions 4 and the base region 3. The $n^+$ type source regions 4 are arranged on both sides of a trench gate structure which will be described later, and the $p^+$ type SiC layers 5 are each formed up to a position deeper than the trench gate structure on an opposite side to the trench gate structure through the $n^+$ type source region 4. The $n^+$ type source region 4 is for example, $2.5 \times 10^{18}$ to $1.0 \times 10^{19}/cm^3$ in n-type impurity concentration on the surface layer portion, and about 0.5 μm in thickness. The $p^+$ type SiC layers 5 are higher in the impurity concentration than the base region 3, and set to, for example, $1.0 \times 10^{17}$ to $1.0 \times 10^{19}/cm^3$ in the p-type impurity concentration. In this embodiment, the $p^+$ type SiC layers 5 are formed to perform both of the function of the $p^+$ type deep layer and the function of the $p^+$ type contact region.

A trench 6 is formed to reach the $n^-$ type drift layer 2 through the base region 3 and the $n^+$ type source regions 4 with a direction perpendicular to a paper plane as a longitudinal direction thereof. The high-concentration base region 3a and the low-concentration base region 3b in the base region 3 and the $n^+$ type source regions 4 described above are arranged to come in contact with the side surfaces of the trench 6.

Further, with a surface layer portion of a portion of the base region 3 located between the $n^+$ type source regions 4 and the $n^-$ type drift layer 2 as a channel region, a gate insulating film 7 is formed on an inner wall surface of the trench 6 including the channel region. A gate electrode 8 made of doped Poly-Si is formed on a surface of the gate insulating film 7, and the trench 6 is embedded with the gate insulating film 7 and the gate electrode 8.

The trench gate structure is configured as described above. The trench gate structure extends with the direction perpendicular to the paper plane in FIG. 1 as a longitudinal direction, and the multiple trench gate structures are aligned in a lateral direction of FIG. 1 into stripes. The $n^+$ type source regions 4 and the $p^+$ type SiC regions 5 described above have a layout structure to extend along the longitudinal direction of the trench gate structures.

Source electrodes 9 and gate lines (not illustrated) are formed on surfaces of the $n^+$ type source regions 4 and the $p^+$ type SiC layers 5, and the surface of the gate electrode 8. The source electrodes 9 and the gate lines are made of multiple metals (for example, Ni/Al, etc.). A portion of the multiple metals which comes in contact with at least n-type SiC (specifically, the $n^+$ type source regions 4 or the gate electrode 8 in the case of the n-type dope) is made of a metal that can come in ohmic contact with the n-type SiC. A portion of the multiple metals which comes in contact with at least p-type SiC (specifically, the $p^+$ type SiC layer 5) is made of a metal that can come in ohmic contact with the p-type SiC. The source electrodes 9 and the gate lines are formed on an interlayer insulating film not shown, and electrically isolated from each other. Through contact holes provided in the interlayer insulating film, the source electrodes 9 are brought into electric contact with the $n^+$ type source regions 4 and the $p^+$ type SiC layers 5, and the gate lines are brought into electric contact with the gate electrode 8.

Further, a drain electrode 10 electrically connected to the $n^+$ type substrate 1 is formed on a rear side of the $n^+$ type substrate 1. With the above structure, the vertical MOSFET having the inverting trench gate structure of the n-channel type is configured. An outer peripheral breakdown voltage structure not shown is provided in an outer peripheral region of the cell region in which the vertical MOSFET is formed to configure the SiC semiconductor device according to this embodiment.

In the vertical MOSFET of the inverting trench gate structure provided in the SiC semiconductor device thus configured, when a gate voltage is applied to the gate electrode 8, a channel is formed on a surface of the base region 3 which comes in contact with the trench 6. With the above configuration, after electrons injected from the source electrode 9 pass through a channel extended from the $n^+$ type source region 4 to the base region 3, the electrons reach the $n^-$ type drift layer 2, and a current flows between the source electrode 9 and the drain electrode 10.

In this situation, in this embodiment, the base region 3 is configured by the high-concentration base region 3a and the low-concentration base region 3b, and the channel is defined by the high-concentration base region 3a and the low-concentration base region 3b. As a result, the following advantages can be obtained.

First, since the high-concentration base region 3a is provided, the expansion of a depletion layer in the base region 3 can be suppressed. For that reason, the base region 3 can be prevented from being fully depleted to allow punch-through, the element breakdown voltage can be ensured, and the gate insulating film 7 on a bottom of the trench 6 can be prevented from being deteriorated. Because the threshold voltage depends on the p-type impurity concentration of the high-concentration base region 3a, a high threshold voltage can be obtained.

Further, since the base region 3 is not all configured by the high-concentration base region 3a, but includes the low-concentration base region 3b, the channel mobility is enhanced in the low-concentration base region 3b. For that reason, even if the high-concentration base region 3a is provided, a reduction in the on-resistance can be performed. Therefore, the vertical MOSFET with the trench gate structure which enables a reduction in an on-resistance and the securement of an element breakdown voltage, and obtains a high threshold voltage can be provided.

In addition, because the high-concentration base region 3a is present, at the off-time, the pull-out effect of carriers generated from a junction between the $n^-$ type drift layer 2 and the base region 3 is increased, and therefore a drain leakage current can be reduced. In other words, the pull-out effect of the carriers in the junction between the $n^-$ type drift layer 2 and the base region 3 becomes higher as the p-type impurity concentration in a portion of the base region 3 which comes in contact with the $n^-$ type drift layer 2 is higher. In the case of this embodiment, the junction is the high-concentration base region 3a. For that reason, as compared with a case in which the base region 3 is all configured by the low-concentration base region 3b, the pull-out effect of the carriers generated from the junction between the $n^-$ type drift layer 2 and the base region 3 is enhanced. Since the high-concentration base region 3a is formed on the overall lower layer portion of the base region 3, the high-concentration base region 3a can be brought into contact with the $n^-$ type drift layer 2 in a more extensive area, and the $n^-$ type drift layer 2 is connected to the $p^+$ type SiC layers 5. For that reason, the carriers can be pulled out through the $p^+$ type SiC layers 5. Therefore, the pull-out effect of the carriers can be more enhanced.

Since a portion of the base region 3 which comes in contact with the $n^-$ type drift layer 2 is all configured by the high-concentration base region 3a high in the p-type impurity concentration, a rising voltage when a current flows into the built-in diode configured by a p-n junction of the $n^-$ type drift layer 2 and the base region 3 can be reduced. For that reason, the on-voltage of the built-in diode is reduced, and a loss reduction at the time of synchronous flow regulation drive aggressively using the built-in diode can be performed.

Furthermore, at the off-time, the depletion layer extending from the high-concentration base region 3a side to the $n^-$ type drift layer 2 side can make it hard that equipotential lines enter below the trench gate structure. For that reason, the electric field concentration applied to the gate insulating film 7 on the bottom of the trench 6 can be reduced, and an improvement in a lifetime of the gate insulating film 7 and an improvement in a reverse bias life can be performed.

Subsequently, a method of manufacturing the SiC semiconductor device configured as illustrated in FIG. 1 according to this embodiment will be described with reference to FIGS. 3A to 3F, and 4.

Figure 3A:
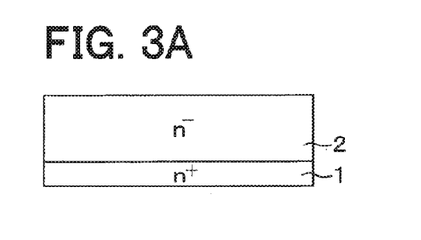
FIGS. 3A to 3F are cross-sectional views illustrating a process of manufacturing an SiC semiconductor device illustrated in FIG. 1.

First, in a process illustrated in FIG. 3A, a so-called epitaxial substrate in which the n− type drift layer 2 made of SiC is epitaxially grown on the surface of the n+ type substrate 1 made of SiC is prepared as the semiconductor substrate.

Figure 3B:
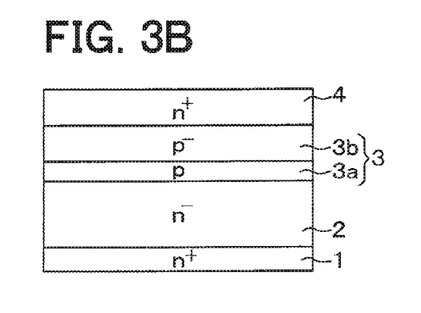
Figure 4:
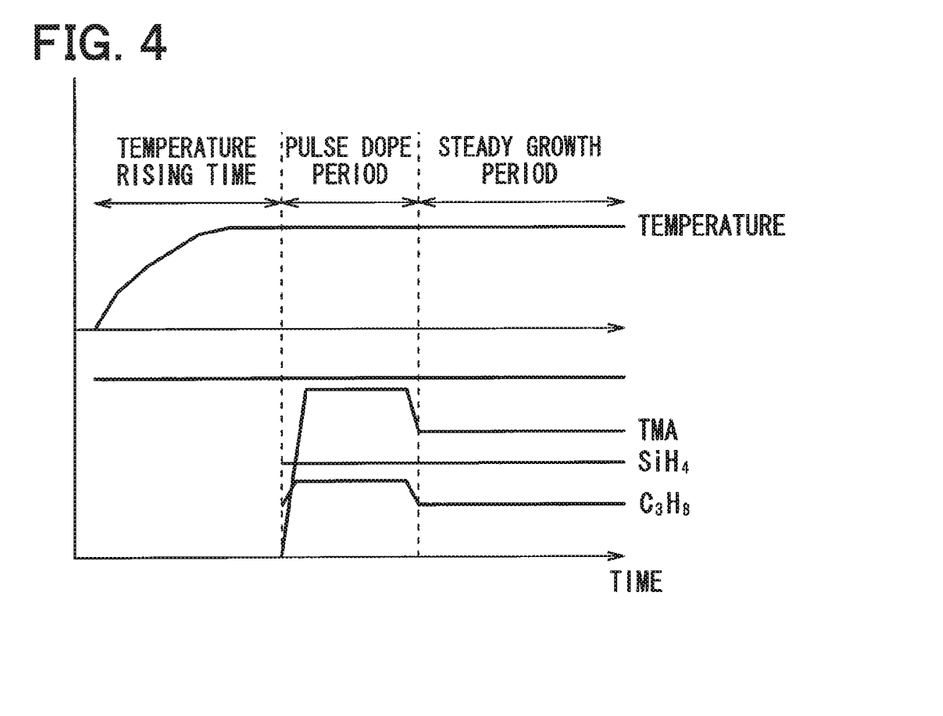
FIG. 4 is a time chart illustrating a temperature and a profile of gas introduction in a process of forming a base region.

In a process illustrated in FIG. 3B, a process of forming the base region 3 on the surface of the n− type drift layer 2 and a process of forming the n+ type source regions 4 on the surface of the base region 3 are performed in order with the use of an epitaxial growth device not shown. Specifically, as illustrated in FIG. 4, a dopant gas including the p-type impurity is first introduced together with SiC raw material gas over a temperature rising period for raising a temperature in the epitaxial growth device.

The SiC raw material gas can be, for example, silane ($SiH_4$) that is an Si raw material or propane ($C_3H_8$) that is a C raw material. The dopant gas for producing the base region 3 is trimethyl aluminum (TMA) including the p-type impurity.

In forming the high-concentration base region 3a, as compared with in forming the low-concentration base region 3b, the doping amount of p-type impurity in the epitaxial growth layer is increased in a pulse-doped period to increase the amount of introduction of TMA in a pulsed manner. At this time, when the Si/C ratio is adjusted by an increase in the introduction amount of propane so that the C ratio is set to be higher than that when forming the low-concentration base region 3b, the amount of doping of the p-type impurity in the epitaxial growth layer can be more increased. Further; after the pulse-doped period, the introduction amount of TMA and the Si/C ratio return to a steady growth state, and the low-concentration base region 3b is formed in the steady growth period. Thus, the base region 3 having the high-concentration base region 3a and the low-concentration base region 3b is formed.

Thereafter, the dopant gas to be introduced into the epitaxial growth device is changed to subsequently form the n+ type source region 4. As the dopant gas at this time, nitrogen ($N_2$) including the n-type impurity is used. Thus, a process of forming the n+ type source region 1 on the surface of the base region 3 is performed.

Figure 3C:
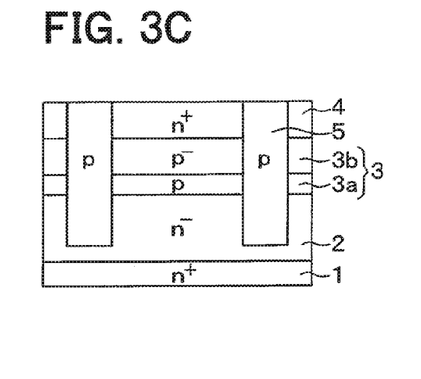

In a process illustrated in FIG. 3C, after a mask material (not illustrated) is placed on the surface of the n+ type source region 4, a position at which the p+ type SiC layer 5 of the mask material is to be formed is opened by photolithography. Further, an anisotropic etching such as a reactive ion etching (RIE) is performed in a state where the mask material is placed to form a trench at the position at which the p+ type SiC layer 5 is to be formed. Thereafter, the mask material is removed, and the p+ type layer is formed on the overall surface of the n+ type source region 4 including the interior of the trench again with the use of the epitaxial growth device. The SiC raw material gas and the dopant gas used in this situation are the same as those in the process of forming the base region 3, and the gas introduction amount is adjusted according to the impurity concentration of the p+ type SiC layers 5.

Further, the surface of the n+ type source region 4 is exposed by planarization caused by grinding and chemical mechanical polishing (CMP). As a result, the p+ type SiC layer 5 is formed by the p+ type layer remaining only within the trench.

Figure 3D:
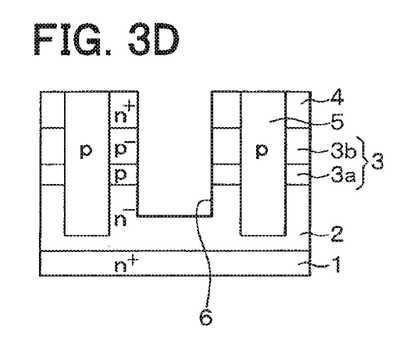

In a process illustrated in FIG. 3D, after a mask material (not illustrated) is placed on the surfaces of the n+ type source region 4 and the p+ type SiC layer 5, a position at which the trench 6 of the mask material is to be formed is opened by photolithography. Further, an anisotropic etching such as RIE is performed in a state where the mask material is placed to form the trench 6 in the cell region. Thereafter, the mask material is removed.

Figure 3E:
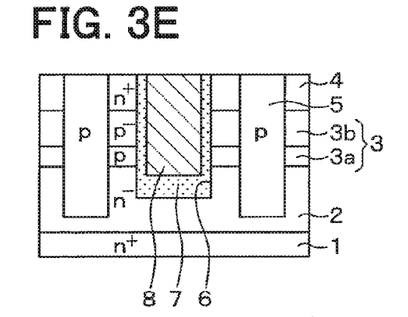

The hydrogen etching is implemented through a heat treatment in a hydrogen atmosphere under decompression at 1600° C. or higher, for example, a high-temperature hydrogen atmosphere of, for example, in a high temperature hydrogen atmosphere of 1625° C., $2.7 \times 10^4$ Pa (200 Torr). A rounding process of the inner wall surface of the trench 6 is performed by hydrogen etching, an opening inlet of the trench 6 and the corner part are rounded, and a damage of trench etching is removed.

Figure 3F:
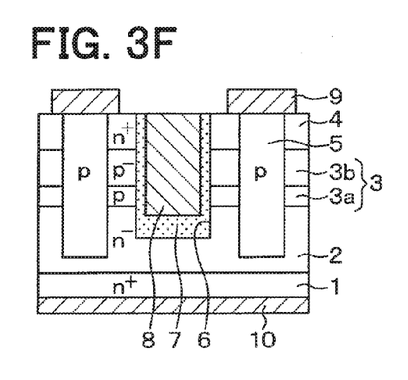

In a process illustrated in FIG. 3F, after the gate insulating film 7 is formed by thermal oxidation with wet atmosphere, a doped Poly-SI layer is formed on the surface of the gate insulating film 7, and the doped Poly-Si layer is patterned and left in the trench 6 to form the gate electrode 8. The subsequent processes are the same as conventional processes. In other words, a process of forming the interlayer insulating film, a process of providing contact holes by photoetching, a process of forming the source electrodes 9 and the gate wiring layer by depositing and then patterning an electrode material, and a process of forming the drain electrode 10 on the rear surface of the n+ type substrate 1 are performed. With the above processes, the SiC semiconductor device in which the vertical MOSFET with the trench gate structure is disposed in the cell region illustrated in FIG. 1 is completed.

As described above, in the SiC semiconductor device having the vertical MOSFET with the inverting trench gate structure described in this embodiment, the base region 3 includes the high-concentration base region 3a and the low-concentration base region 3b. For this reason, the vertical MOSFET with the trench gate structure which enables a reduction in an on-resistance and the securement of an element breakdown voltage, and obtains a high threshold voltage can be provided.

Second Embodiment

A second embodiment of the present disclosure will be described. In this embodiment, the configuration of the p+ type SiC layer 5 is changed as compared with the first embodiment, and other configurations are identical with those in the first embodiment. Therefore, only parts different from those in the first embodiment will be described.

Figure 5:
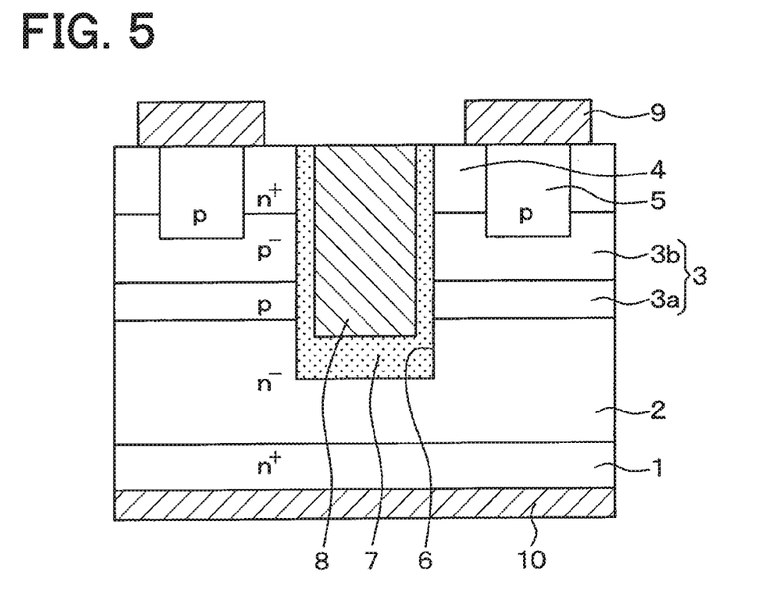
FIG. 5 is a cross-sectional view of an SiC semiconductor device having a vertical MOSFET with an inverting trench gate structure according to a second embodiment of the present disclosure.

As illustrated in FIG. 5, in this embodiment, as compared with the first embodiment, a depth of p+ type SiC layers 5 is shallowed to a position at which the p+ type SiC layers 5 come into contact with the base region 3. Even with the provision of the p+ type SiC layers 5 configured as described above, the respective advantages described in the first embodiment can be obtained. Because the p+ type SiC layers 5 may not be formed deeply, the p+ type SiC layers 5 can be formed by ion implantation of the p-type impurity from the surface of the n+ type source regions 4. Therefore, as compared with a case in which the p+ type SiC layers 5 are formed by embedding the trench with the p+ type layer as in the first embodiment, the manufacturing process can be simplified with the structure of this embodiment.

However, the p$^+$ type SiC layers 5 according to this embodiment function as the p$^+$ type contact region, but do not have the depth as deep as the p$^+$ type SiC layers 5 come into contact with the high-concentration base region 3a unlike the first embodiment. For that reason, among the respective advantages described, in the first embodiment, the pull-out effect of carriers at the off-time cannot be sufficiently obtained. Therefore, the structure according to the first embodiment is higher in an effect of reducing a drain leak current at the off-time.

Third Embodiment

A third embodiment of the present disclosure will be described. Similarly, in this embodiment, the configuration of the p$^+$ type SiC layer 5 is changed as compared with the first embodiment, and other configurations are identical with those in the first embodiment. Therefore, only parts different from those in the first embodiment will be described.

Figure 6:
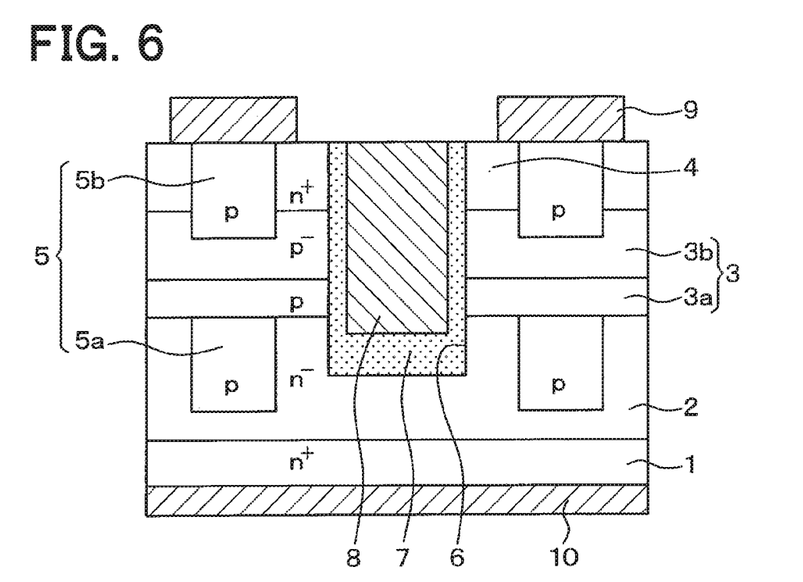
FIG. 6 is a cross-sectional view of an SiC semiconductor device having a vertical MOSFET with an inverting trench gate structure according to a third embodiment of the present disclosure.

As illustrated in FIG. 6, in this embodiment, the p$^+$ type SiC layers 5 are divided into two pieces in the depth direction. Specifically, the p$^+$ type SiC layers 5 include a lower layer portion 5a formed up to a position deeper than a trench gate structure from a surface of an n$^-$ type drift layer 2, and an upper layer portion 5b formed to reach a base region 3 from a surface of an n$^+$ type source regions 4. The lower layer portion 5a functions as a p$^+$ type deep layer, and the upper layer portion 5b functions as a p$^+$ type contact layer.

Even with the provision of the p$^+$ type SiC layers 5 configured as described above, the respective advantages described in the first embodiment can be obtained. The lower layer portion 5a can be formed by ion implantation from the surface of the n$^-$ type drift layer 2 before the formation of the base region 3 after the n$^-$ type drift layer 2 has been formed. Likewise, the upper layer portion 5b can be formed by ion implantation of impurity from the surface of the n$^+$ type source regions 4. Therefore, as compared with a case in which the p$^+$ type SiC layers 5 are formed by embedding the trench with the p$^+$ type layer as in the first embodiment, the manufacturing process can be simplified with the structure of this embodiment.

Fourth Embodiment

A fourth embodiment of the present disclosure will be described. Similarly, in this embodiment, the configuration of the base region 3 is changed as compared with the first embodiment, and other configurations are identical with those in the first embodiment. Therefore, only parts different from those in the first embodiment will be described.

Figure 7:
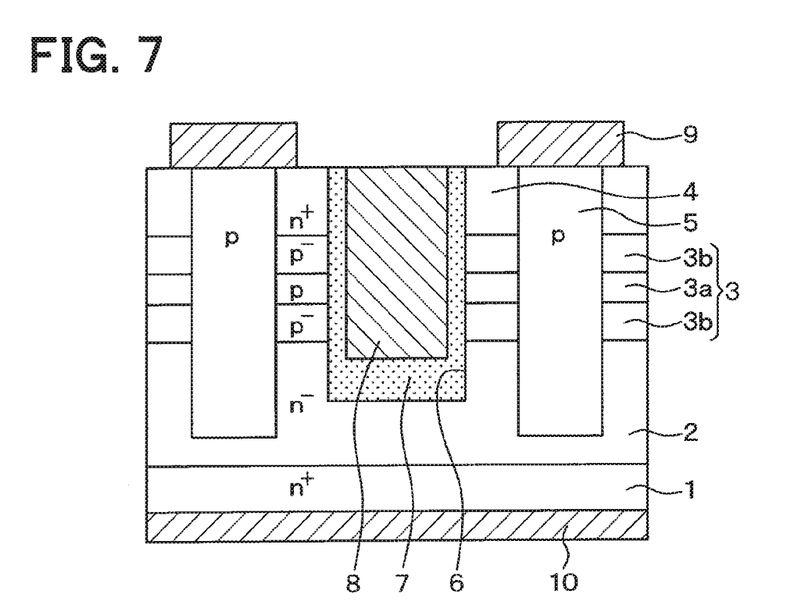
FIG. 7 is a cross-sectional view of an SiC semiconductor device having a vertical MOSFET with an inverting trench gate structure according to a fourth embodiment of the present disclosure.

As illustrated in FIG. 7, in this embodiment, a high-concentration base region 3a in a base region 3 is disposed at an intermediate position of a low-concentration base region 3b in a depth direction. In other words, the high-concentration base region 3a is sandwiched between the low-concentration base regions 3b.

As described above, even if the high-concentration base region 3a is disposed at the intermediate position of the low-concentration base region 3b in the depth direction, the respective advantages described in the first embodiment can be obtained. A portion of the base region 3 which comes in contact with the n$^-$ type drift layer 2 is not the high-concentration base region 3a but the low-concentration base region 3b. For that reason, among the respective advantages described in the first embodiment, the low on-voltage of the built-in diode, the improvement in the lifetime of the gate insulating film 7, and the improvement in a reverse bias life are not sufficient.

Other Embodiments

The present disclosure is not limited to the present embodiments described above and modifications can be suitably performed within a range of the appended claims.

For example, the base region 3 is divided into the high-concentration base region 3a and the low-concentration base region 3b. In those boundaries, the impurity concentration gradually changes, and the high-concentration base region 3a and the low-concentration base region 3b which are different in the p-type impurity concentration may be laminated over each other through the boundary therebetween. The low-concentration base region 3b may be made of i-type semiconductor undoped (almost undoped with p-type impurity). For example, the doping amount of the low-concentration base region 3b can be as large as the p-type impurity remaining in the atmosphere at the time of epitaxial growth is doped. In that case, higher channel mobility in the low-concentration base region 3b can be further realized, and lower on-resistance can be further performed.

Further, in the above respective embodiments, a structure in which the n$^-$ type drift layer 2 is formed on the surface of the n$^+$ type substrate 1 has been exemplified as the semiconductor substrate in which the rear surface side is the high-concentration impurity layer, and the front surface side is a drift layer having the impurity concentration lower than the high concentration impurity layer. However, the above configuration is merely an example of the semiconductor substrate. For example, the semiconductor substrate may configure the high-concentration impurity layer by ion-implanting the n-type impurities on the rear surface side of the substrate configured by the n$^-$ type drift layer 2, or epitaxial growth.

Also, in the above respective embodiments, the vertical MOSFET of the n-channel type in which the first conductivity type is n-type, and the second conductivity type is p-type has been described as an example. Alternatively, the present disclosure can be applied to the vertical MOSFET of the p-channel type in which the conductivity type of the respective components is reversed.

The invention claimed is:
1. A silicon carbide semiconductor device comprising:
a vertical MOSFET that includes
a semiconductor substrate that is made of silicon carbide having a first conductivity type, and includes a high-concentration impurity layer arranged on a rear surface side and a drift layer arranged on a front surface side and having an impurity concentration lower than the high-concentration impurity layer;
a base region that is made of silicon carbide, and arranged on the drift layer;
a source region that is arranged in an upper portion of the base region, and made of silicon carbide having the first conductivity type with an impurity concentration higher than the drift layer;
a trench gate structure that includes a trench extending from a surface of the source region to a position deeper than the base region, a gate insulating film arranged on an inner wall of the trench, and a gate electrode arranged on the gate insulating film;
a source electrode that is electrically connected to the source region; and a drain electrode that is electrically connected to the high-concentration impurity layer on the rear surface side of the semiconductor substrate, wherein the base region has a high-concentration base region and a low-concentration base region, which are stacked each other, the low-concentration base region having a second conductivity type with an impurity concentration lower than the high-concentration base region, each of the high-concentration base region and the low-concentration base region contacts a side surface of the trench, in the base region, the high-concentration base region and the low-concentration base region are stacked on a surface of the drift layer in turn, and the high-concentration base region contacts the drift layer.

2. The silicon carbide semiconductor device according to claim 1, wherein:

in the base region, the low-concentration base region is arranged on a surface of the drift layer, and the high-concentration base region is arranged at an intermediate position of the low-concentration base region in a depth direction.

3. The silicon carbide semiconductor device according to claim 1, wherein:

the high-concentration base region has the second conductivity type with the impurity concentration equal to or higher than $5.0 \times 10^{17}$ cm$^3$, and a thickness in a range between 30 nanometers and 200 nanometers.

4. The silicon carbide semiconductor device according to claim 1, wherein:

the low-concentration base region is a layer, in which an impurity having the second conductivity type is not doped.

5. The silicon carbide semiconductor device according to claim 1, further comprising:

a second conductivity type silicon carbide layer epitaxially embedded within another trench, which extends from a surface of the source region to the drift layer through the base region and is deeper than the trench gate structure, and having an impurity concentration higher than the low-concentration base region.

6. The silicon carbide semiconductor device according to claim 1, further comprising:

a second conductivity type deep layer that extends from the surface of the drift layer to a position deeper than the trench gate structure; and a second conductivity type contact layer that extends from the surface of the source region to the base region.

7. A method of manufacturing a silicon carbide semiconductor device, comprising:

preparing a semiconductor substrate, which is made of silicon carbide having a first conductivity type, and includes a high-concentration impurity layer on a rear surface side and a drift layer arranged on a front surface side and having an impurity concentration lower than the high-concentration impurity layer;

forming a base region made of silicon carbide on the drift layer;

forming a source region, which is made of silicon carbide having the first conductivity type with an impurity concentration higher than the drift layer, in an upper portion of the base region;

forming a trench extending from a surface of the source region to a position deeper than the base region;

providing a trench gate structure by forming a gate insulating film on an inner wall of the trench, and forming a gate electrode on the gate insulating film;

forming a source electrode electrically connected to the source region; and forming a drain electrode electrically connected to the high-concentration impurity layer on the rear surface side of the semiconductor substrate, wherein:

in the forming of the base region, a high-concentration base region and a low-concentration base region having a second conductivity type with an impurity concentration lower than the high-concentration base region are stacked each other, the high-concentration base region and the low-concentration base region are stacked on a surface of the drift layer in turn, and the high-concentration base region contacts the drift layer; and in the forming of the trench, the trench is formed to be deeper than the base region, and each of the high-concentration base region and the low-concentration base region contacts a side surface of the trench.

8. The method of manufacturing the silicon carbide semiconductor device according to claim 7, wherein:

in the forming of the base region, a silicon carbide raw material gas and trimethyl aluminum as a second conductivity type impurity dopant are introduced into an epitaxial growth chamber, and an introduction amount of the trimethyl aluminum and a ratio of carbon to silicon in a forming of the high-concentration base region are set to be larger than in a forming of the low-concentration base region.

* * * * *